United States Patent [19]
Jain et al.

[11] Patent Number: 5,598,425
[45] Date of Patent: Jan. 28, 1997

[54] HIGH STABILITY ULTRA-SHORT SOURCES OF ELECTROMAGNETIC RADIATION

[75] Inventors: Ravinder K. Jain, Albuquerque, N.M.; John G. McInerney, Cork, Ireland; Kalidev'Apura P. J. Reddy, Mathikere, India; Chi Yan, Albuquerque, N.M.

[73] Assignee: University of New Mexico, Albuquerque, N.M.

[21] Appl. No.: 153,012

[22] Filed: Nov. 15, 1993

[51] Int. Cl.$^6$ .................................................. H01S 3/098
[52] U.S. Cl. .................................. 372/18; 372/25; 372/26
[58] Field of Search .................................. 372/18, 19, 25, 372/26, 28, 30, 38

[56] References Cited

U.S. PATENT DOCUMENTS

| | | | |
|---|---|---|---|
| 3,586,997 | 6/1971 | Kinsel | 372/18 |
| 3,624,544 | 11/1971 | De Maria | 372/18 |
| 3,656,068 | 4/1972 | Runge | 372/18 |
| 4,319,203 | 3/1982 | Brosio et al. | 372/30 |
| 4,665,524 | 5/1987 | Cotter | 372/18 |
| 4,698,817 | 10/1987 | Burley | 372/31 |

OTHER PUBLICATIONS

Burns et al., "Noise Characterization of a Mode–Locked InGaAsP Semiconductor Diode Laser", IEEE Journal of Quantum Electronics, vol. 26, No. 11, pp. 1860–1863 Nov. (1990).

Derickson et al., "Residual and Absolute Timing Jitter in Actively Mode–Locked Semiconductor Laser", Electronics Letters, vol. 26, No. 24, pp. 2026–2028 Nov. (1990).

Nietzke et al., "Mode Locking of a Semiconductor Laser by Self–Synchronising Optoelectronic Feedback of the Longitudinal Mode Beats", Electornics Letters, vol. 26, No. 14, pp. 1016–1018 Jul. (1990).

Derickson et al., "Self–mode–locking of a semiconductor laser using positive feedback", Appl. Phys. Lett., vol. 56, No. 1, pp. 7–9 Jan. (1990).

*Primary Examiner*—Rodney B. Bovernick
*Assistant Examiner*—Robert E. Wise
*Attorney, Agent, or Firm*—Bruce H. Cottrell

[57] ABSTRACT

A source of electromagnetic radiation including an output, means for generating a drive signal derived from a regenerative feedback signal generated from a portion of said output, further characterized in that an electrical signal obtained from said portion of said output is passed through a narrow bandpass filter in generating said regenerative feedback signal, and means for modulating said electromagnetic radiation within the cavity when the modulating means is driven by said drive signal is disclosed together with a method of generating short pulse electromagnetic radiation signals including operating a electromagnetic radiation source having an output, generating a drive signal derived from a regenerative feedback signal generated from a portion of said output, further characterized in that said portion of said output is passed through a narrow bandpass filter in generating said regenerative feedback signal, and, modulating said electromagnetic radiation, said drive signal derived from a regenerative feedback signal generated from a portion of said output.

17 Claims, 4 Drawing Sheets

Vertical Display 10 db/ Frequency Range 0-1.5 GHz Resolution Bandwidth 3 MHz

HIGH STABILITY ULTRA-SHORT SOURCES OF ELECTROMAGNETIC RADIATION

FIELD OF THE INVENTION

The present invention relates to the field of lasers and other sources of electromagnetic radiation for generation of high stability short pulses, and more particularly relates to short pulse generation in laser sources using regenerative mode-locking.

BACKGROUND OF THE INVENTION

Mode-locked semiconductor lasers are attractive sources of picosecond pulses for numerous applications, e.g., high bit rate optical communications, ultrafast photonic switching, optical radar and time-resolved electro-optical sampling. Although semiconductor lasers have been previously mode-locked by passive, synchronous, hybrid and colliding pulse techniques, active mode-locking is the most commonly used mode-locking technique. Active mode-locking is accomplished by modulating the gain of the semiconductor laser in an external cavity at a frequency equal to or an exact integer multiple of the frequency spacing between the longitudinal modes, and is most frequently used to generate picosecond pulses. Active mode-locking is most effectively achieved when the transit time of the external cavity matches exactly with the period of the modulation current. For several applications, e.g., in digital communications links, optical clocking of high speed digital computers and sampling measurements, the noise characteristics of the pulse train in terms of amplitude or pulse energy fluctuations and phase or pulse time jitter are of prime importance and together with the pulse duration of the laser, effectively define the maximum available bit rate and sampling bandwidth respectively. Unfortunately, in the case of active mode-locking even a slight detuning between the RF modulation frequency and the cavity transit time results in a phase shift between the modulation and the mode-locked pulse train, which leads to instabilities in the mode-locking process, degrading both the pulsewidth and the stability of the output. Such a degradation can result in the repetition rate of the pulses fluctuating with time. Hence, both a well-stabilized laser cavity and a highly stable (and usually expensive) RF signal generator are typically required for conventional active mode-locking of semiconductor lasers.

Examples of active mode-locking with reasonably high stability but using relatively expensive equipment such as ultrastable RF synthesizers are described, e.g., by Burns et al. in "Noise Characterization of a Mode-Locked InGaAsP Semiconductor Diode Laser" (IEEE J. Quantum Electron., Vol. 26, pp. 1860–1863, 1990) and by Derickson et al. in "Residual and Absolute Timing Jitter in Actively Mode-Locked Semiconductor Lasers" (Electron. Lett., Vol. pp. 2026–2028, 1990).

Other examples of mode-locking systems are described in "Self-mode-locking of a semiconductor laser using positive feedback", by Derickson et al. (Appl. Phys. Lett., Vol. 56, pp. 7–9, 1990), wherein a mode-locking technique called self-mode-locking was described using a high-speed optical to electrical converter in a positive feedback configuration to convert the output optical pulses back into electrical drive signals in a regenerative process, such a self-mode-locking including both coordinated optical and electrical feedback to obtain short pulses, and in "Mode Locking of a Semiconductor Laser by Self-Synchronising Optoelectronic Feedback of the Longitudinal Mode Beats" by Nietzke et al. (Electron. Lett., Vol. 26, pp. 1016–1018 (1990) wherein self-synchronised mode locking was achieved by optoelectronic feedback of amplified RF beats of the longitudinal modes of an external cavity semiconductor laser, which RF was superimposed onto the DC injection current to obtain short pulses. Similar optoelectronic feedback schemes have been employed for gas and solid state lasers. While these systems can be considered regenerative mode-locking, there is no indication that either of such systems has the stable repetition rate that would be necessary for numerous applications.

Accordingly, it is an object of the present invention to provide a high stability mode-locked short pulse laser source without the use of an external highly stable RF signal generator tuned to an integral or subintegral multiple of the resonance frequency of the laser cavity.

It is another object of the present invention to provide a high stability short pulse source for electromagnetic radiation without the use of a highly stable signal generator tuned to an integral or sub-integral multiple of the resonance frequency of the cavity containing an amplifier of that electromagnetic radiation.

Still another object of this invention is to provide a method of generating short pulses from a highly stable mode-locked laser source.

Yet another object of this invention is to provide a method of generating short pulses from a highly stable source of electromagnetic radiation.

SUMMARY OF THE INVENTION

To achieve the foregoing and other objects, and in accordance with the purposes of the present invention, as embodied and broadly described herein, the present invention provides a source of electromagnetic radiation consisting essentially of an amplifying medium and a resonant cavity having an output, means for generating a drive signal derived from a regenerative feedback signal generated from a portion of said output, further characterized in that said portion of said output is passed through a narrow bandpass filter in generating said regenerative feedback signal, and, means for modulating said electromagnetic radiation within the cavity, said modulation means driven by said drive signal whereby subsequent output is characterized as having pulse durations shorter than about 10,000 periods of the center frequency of said electromagnetic radiation unless restricted to longer pulse. durations by the gain band width of the amplifying medium.

In one embodiment, the present invention provides a mode-locked laser source including a laser having an output, means for generating a drive signal derived from a regenerative feedback signal generated from a portion of said laser output, further characterized in that an electrical signal obtained from said portion of said laser output is passed through a narrow bandpass filter in generating said regenerative feedback signal, and means for modulating said laser radiation when the modulation means is driven by said drive signal. Preferably, the narrow bandpass filter has a center frequency corresponding to the inverse of the laser cavity transit time.

In another embodiment, a mode-locked laser source consists essentially of an optical gain medium driven by an appropriate energy source, said optical gain medium having an output from a cavity, a photodetector for converting a portion of said output into an electrical signal, a narrow bandpass filter for limiting the frequency band of said electrical signal, and, a modulator for applying said filtered electrical signal to the cavity radiation. In yet another embodiment, such a mode-locked laser source can consist essentially of a laser driven by a selected DC bias, said laser having an output, an optical delay for control of a phase shift in a portion of said laser output, a photodetector for converting said delayed portion of said laser output into an electrical signal, an amplifier for amplifying said electrical signal, a bandpass filter for limiting the frequency band of said amplified electrical signal, a second amplifier for conditioning said filtered electrical signal, and a bias tee for superimposing said amplified filtered electrical signal with the selected DC bias prior to electrical input into the laser.

The present invention further provides a method of generating short pulse electromagnetic signals comprising operating a source of electromagnetic radiation having an output, generating a drive signal derived from a regenerative feedback signal generated from a portion of said output, said output maintained in a delay prior to focus upon a detector for generation of said electrical signal, further characterized in that said portion of said output is passed through a narrow bandpass filter in generating said regenerative feedback signal, and, modulating said electromagnetic radiation within said cavity, said modulation driven by said drive signal derived from a regenerative feedback signal generated from a portion of said output whereby said short pulses are characterized as having durations shorter than about 10,000 periods of the center frequency of said electromagnetic radiation unless restricted to longer pulse durations by the gain band width of the amplifying medium. In another embodiment of the invention is provided a method of generating short pulse optical signals including operating a laser having an output, generating a drive signal derived from a regenerative feedback signal generated from a portion of said laser output, further characterized in that said portion of said laser output is passed through a narrow bandpass filter in generating said regenerative feedback signal, and, superimposing upon a bias current of said laser, said drive signal derived from a regenerative feedback signal generated from a portion of said laser output.

DETAILED DESCRIPTION

The present invention is concerned with high stability short pulse sources of electromagnetic radiation such as microwaves, x-rays and light. The present invention is further concerned with regenerative mode-locking of short pulse sources, e.g., a short pulse semiconductor laser. By "mode-locking" is meant a process wherein resonant longitudinal modes of a laser cavity are synchronized in phase so as to produce a train of light pulses in the laser output. By "regenerative" is meant using feedback to initiate and stabilize a pulse train by constant regeneration.

As noted above, in active mode-locking, the period of the active modulation is fine tuned to precisely match the transit time of the external cavity. A slight detuning between the modulation period and the cavity round trip transit time results in a phase shift between the modulation and the mode-locked pulse train, which in turn leads to instabilities in the mode locking process, degrading both the pulsewidth and the stability of the output. Hence, both a well-stabilized laser cavity and a highly stable RF signal generator are required for conventional active mode-locking of semiconductor lasers.

In contrast, in the specific case of lasers such as semiconductor lasers, the present invention involves regenerative mode-locking wherein the undesirable phase shift between the modulation and the mode-locked pulse train is automatically eliminated, allowing high stability positive feedback mode-locking of semiconductor lasers without the use of an ultrastable RF signal source or active cavity stabilization. This results from use of a narrow bandpass filter having a center frequency corresponding to the inverse of the laser cavity transit time thereby linking the feedback signal to the output and automatically eliminating fluctuations caused by variation in the laser cavity. The regenerative mode-locking in the present invention essentially uses an optoelectronic oscillator.

Among the lasers that can be employed in the present invention are included, e.g., semiconductor lasers, gas lasers and solid state lasers. Generally with a semiconductor laser, the laser will include an antireflection (AR) coating upon at least one of the laser facets. Such an antireflection coating will generally have a reflectivity of less than about 5 percent, preferably a reflectivity of less than about 1 percent and more preferably a reflectivity of less than about 0.1 percent.

Figure 1:
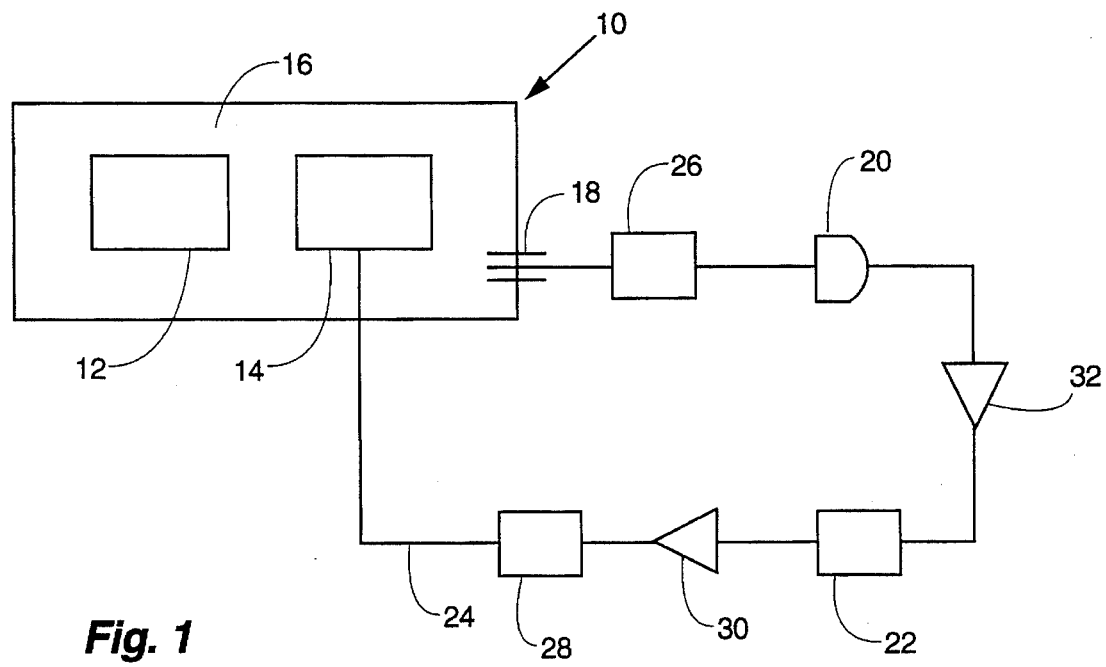
FIG. 1 is a schematic block diagram of a highly stable ultra-short pulse source of electromagnetic radiation in accordance with the present invention.

Referring to the figures, in FIG. 1 is shown a diagram of a highly stable ultra-short pulse source 10 of electromagnetic radiation. Source 10 includes an amplifier 12 together with modulator 14 within resonator cavity 16 having an output coupling 18. The output from output coupling 18 passes to detector 20, then through narrow bandpass filter 22 before being fed back via feedback loop 24 to modulator 14. Optionally, a delay line 26 can be added between output coupling 18 and detector 20 for providing a phase shift. Also optional is a delay 28 that can be added into the feedback loop 24 between narrow bandpass filter 22 and modulator 14. Another option is the addition of amplifier 30 after narrow bandpass filter 22, but before modulator 14. Still another option is the addition of amplifier 32 after detector 20, but before narrow bandpass filter 22. Other elements may be added as desired to provide additional control of bandwidths and wavelengths.

The resultant output from the high stability ultrashort sources of the present invention is characterized as having pulse durations of shorter than about 10,000 periods of the center frequency of the output electromagnetic radiation, preferably shorter than about 5,000 periods, and more preferably shorter than about 1,000 periods unless restricted to longer pulse durations by the gain band width of the amplifying medium.

Figure 2:
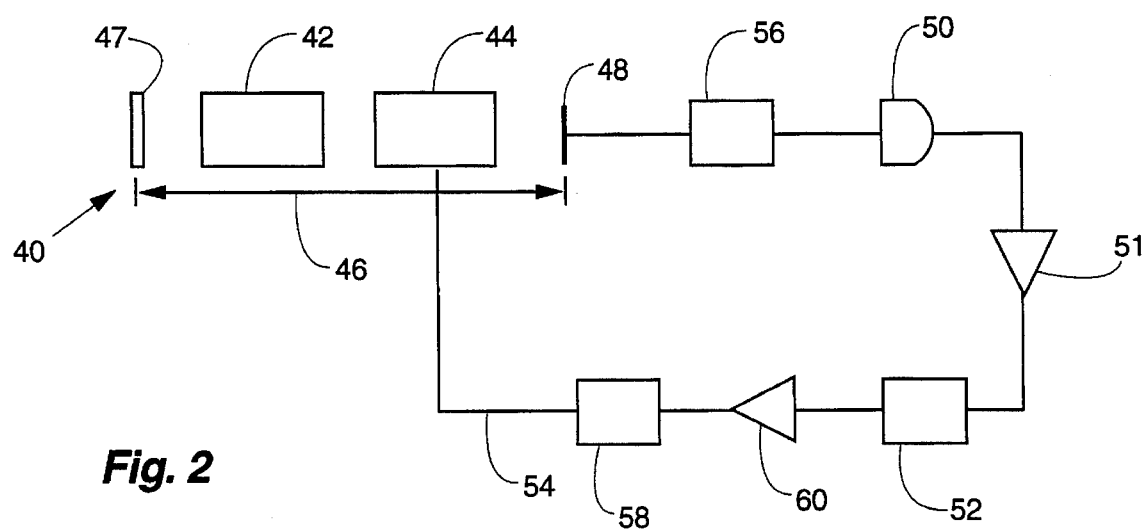
FIG. 2 is a schematic block diagram of a highly stable ultra-short pulse laser source in accordance with the present invention.

In another embodiment of the invention, FIG. 2 shows a highly stable ultra-short pulse laser source 40. Laser source 40 includes a light amplifier 42 together with a light modulator 44 within laser cavity or optical resonator 46 having, e.g., a partially transmitting mirror 48 and second mirror 47 which may be, e.g., a highly reflective mirror. A portion of laser output from laser cavity 46, passes to detector 50, then through narrow bandpass filter 52 before being fed back via feedback loop 54 to modulator 44. Optionally, a delay line 56 can be added between output coupling 48 and detector 50 for providing a phase shift. Also optional is a delay 58 that can be added into the feedback loop 54 between narrow bandpass filter 52 and modulator 44. Another option is the addition of amplifier 60 after narrow bandpass filter 52 but before modulator 44. Still another option is the addition of amplifier 51 after detector 50 but before narrow bandpass filter 52. Other elements may be added as desired such as, e.g., lenses for beam shaping and optical filters to provide additional control of bandwidths and wavelengths.

The resultant output from the high stability ultrashort sources of the present invention is characterized as having pulse durations of shorter than about 10,000 periods of the center frequency of the output laser, preferably shorter than about 5,000 periods, and more preferably shorter than about 1,000 periods unless restricted to longer pulse durations by the gain band width of the amplifying medium.

Figure 3:
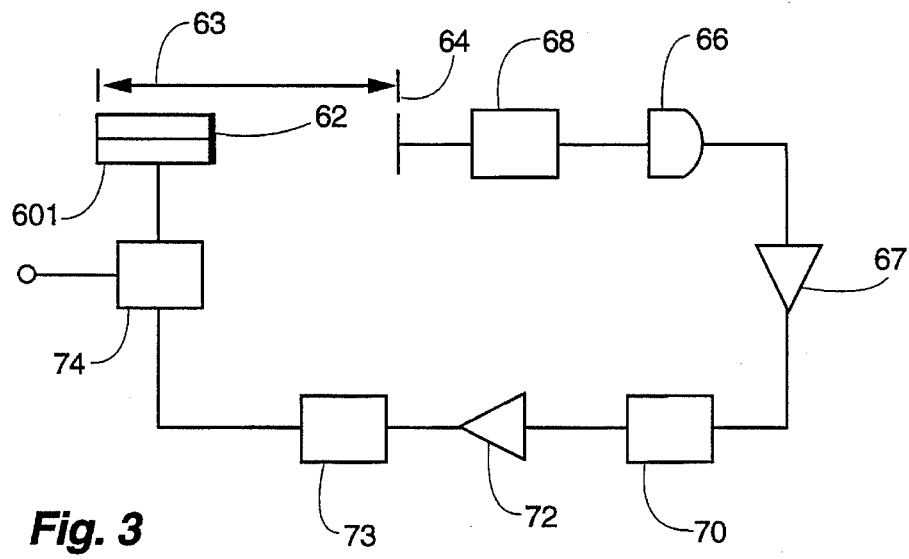
FIG. 3 is a schematic block diagram of a highly stable mode-locked ultra-short pulse semiconductor laser source in accordance with the present invention.

FIG. 3 shows the schematic of the regenerative mode-locking technique employing a diode laser 601. The diode laser 601 (with an antireflection (AR) coating 62 on one facet) is incorporated in an external cavity including a partially transmitting mirror 64. In another arrangement, a grating reflector could be used in place of the partially transmitting mirror for wavelength tuning of the diode laser 601, The laser light leaking from the non-AR coated facet is focused (optionally with a lens) onto a fast photodetector 66 after passing through an optional optical delay line 68 used for fine tuning of the phase shift. The RF output of the photodetector, corresponding to the lowest beat frequency obtained by mixing of the longitudinal modes of the external cavity, is passed through narrow bandpass filter 70, optionally selectively amplified by amplifier 72 and superimposed on a DC bias using a bias tee 74. Unlike external active mode locking, the modulation here is derived from the beating of the longitudinal modes of the optical cavity. Thus, changes in the cavity length, due, e.g., to the mechanical, thermal variations, wavelength tuning, and the like, automatically result in corresponding changes in the rf modulation signal used for mode locking, and perfect synchronism can be maintained at all times between the optical cavity and the electrical modulation signal.

The present invention is more particularly described in the following example which is intended as illustrative only, since numerous modifications and variations will be apparent to those skilled in the art.

EXAMPLE 1

Figure 4:
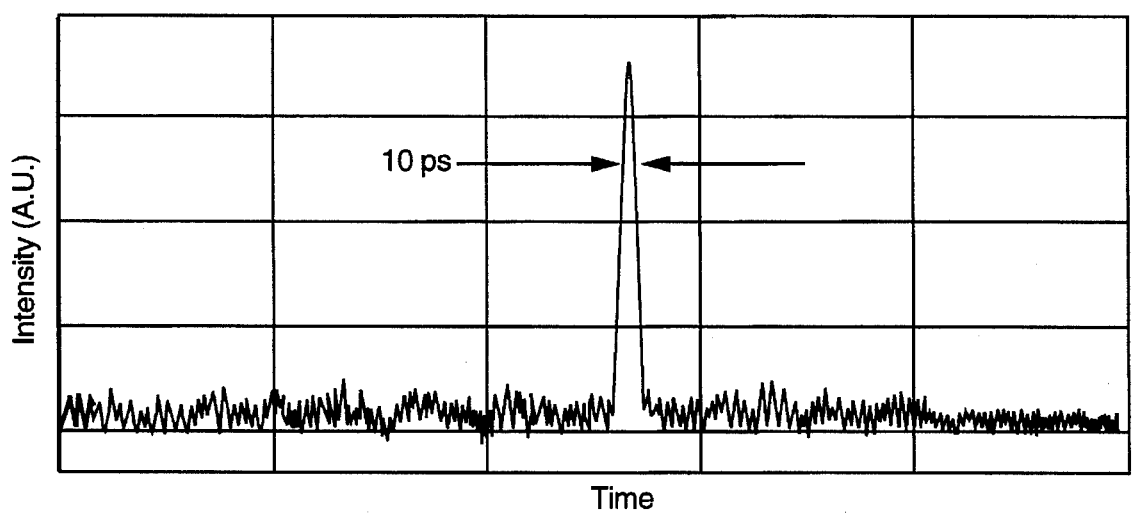
FIG. 4 is a graph showing a single shot streak camera trace of a 10 ps pulse from the mode-locked semiconductor laser in accordance with the present invention.
Figure 5A:
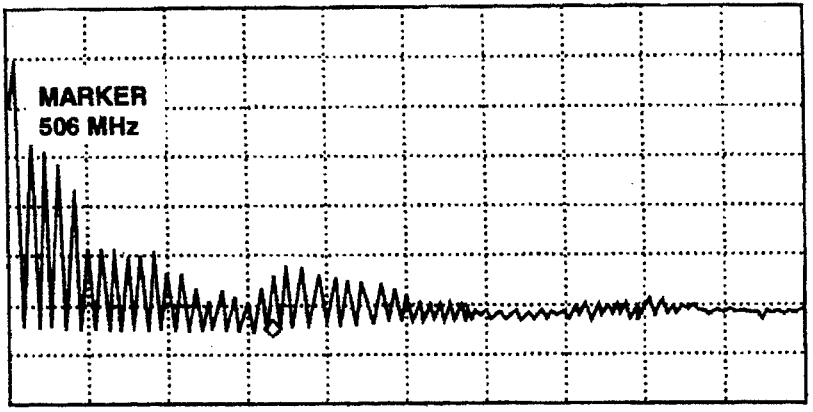
FIG. 5(a), (b) and (c) are graphs illustrating the subharmonic frequencies being generated under most unmatched phase delay conditions with the regenerative pulse feedback condition where (a) and (b) are without any bandpass filter showing the instability and (c) includes the bandpass filter.
Figure 5B:
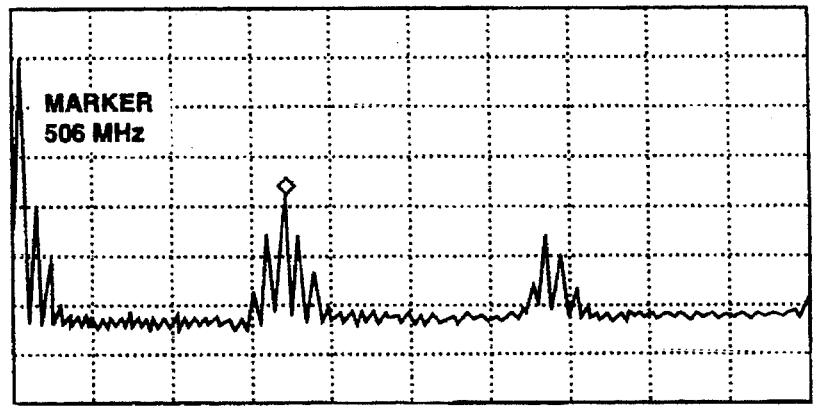
Figure 5C:
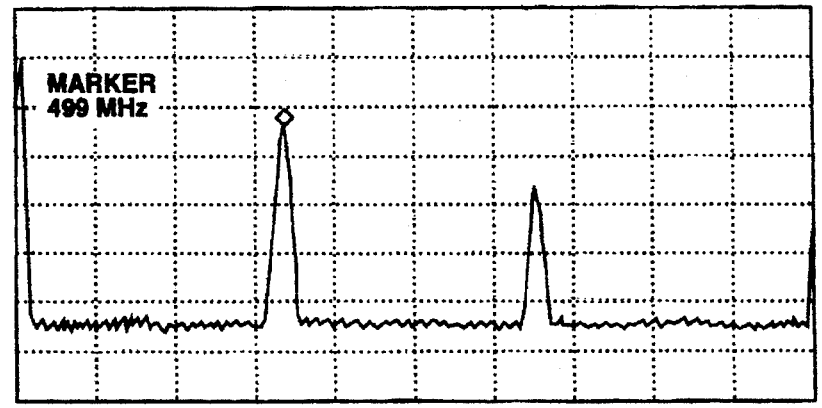

Commercially available semiconductor laser diodes including an antireflection-coating on one facet, have been mode-locked using a regenerative mode-locking technique. Using a Hitachi laser diode at 828 nm and with an external cavity length of 30 cm, the center frequency of an RF bandpass filter was set at 500 MHz, that is, the inverse of the cavity transit time. The RF output of the photodetector in an optoelectronic feedback loop was selectively amplified by 60 dB and phase-shifted before applying to the laser diode. When the dc bias of the laser diode was adjusted to an initial value of slightly above threshold, the laser started operating in a mode-locked manner, emitting a stable train of pulses of about 10 ps duration. The dc bias could subsequently be lowered to below the initial threshold level and the laser still continued to mode-lock, emitting pulses with peak powers of over 100 mW. In contrast to earlier experiments by others on diode lasers using regenerative mode-locking, we have used a narrow bandpass RF filter in the regenerative feedback loop in our experiments. In FIG. 4 is shown a single shot streak camera trace of a single pulse width from a mode-locked semiconductor laser in accordance with the present invention. The pulse duration was about 10 ps and peak power of pulses of over 100 mW were obtained. Also shown in FIG. 5(a), (b) and (c) are the sub-harmonic frequencies being generated under most unmatched phase delay conditions with the regenerative pulse feedback condition where (a) and (b) are without any bandpass filter and (c) includes the bandpass filter. It can be seen that the noise of the signal is substantially reduced by the use of the bandpass filter.

Figure 6:
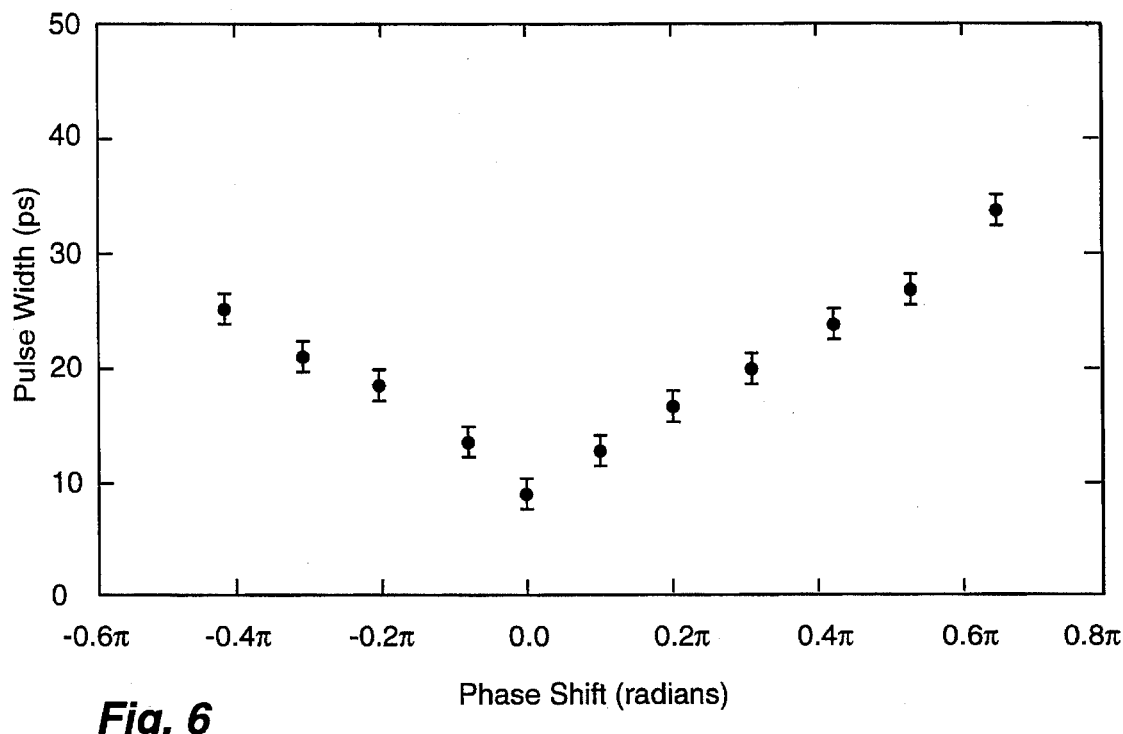
FIG. 6 is a graph illustrating the variation of the pulse width from the laser plotted as a function of the phase shift of the regenerative feedback signal, with the phase shift at which the minimum pulse width of 10 ps is obtained designated as zero on the x-axis.
Figure 7:
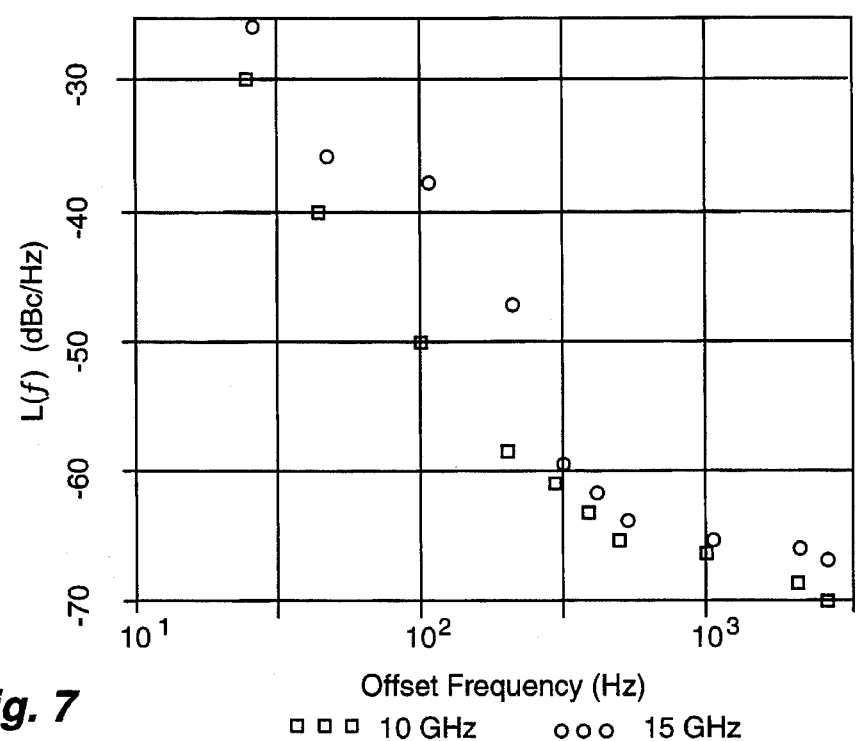
FIG. 7 is a graph illustrating single sideband noise plots with the noise amplitude in dBc per Hertz plotted against frequency offset in Hertz similar to the analysis technique shown in Burns et al. cited above.

Variation in pulse widths from the laser were plotted as a function of the phase shift of the regenerative feedback signal, with the phase shift at which the minimum pulse width of 10 ps was obtained designated as zero on the x-axis. These variations are seen in FIG. 6 and demonstrate control of pulse width by adjusting the phase shift or timing delay. Finally, the stability of the present system is shown by FIG. 7 illustrating single sideband noise plots with the noise amplitude in dBc per Hertz plotted against frequency offset in Hertz. The data of FIG. 7 represents a pulsewidth and pulse timing jitter of less than about 1 ps indicative of highly improved stability of the mode-locked laser.

In conclusion, we describe the generation of ultrashort pulses in semiconductor lasers with the use of regenerative feedback schemes that use relatively simple off-the-shelf electronic components and circumvent the need to use any external RF oscillators to drive the semiconductor lasers. Pulsewidth as short as about 10 ps have been obtained by regenerative mode-locking.

While much of the above description has focused upon lasers and the corresponding portions of the electromagnetic spectrum, the principles demonstrated may be similarly applied to other regions of the electromagnetic spectrum to provide general high stability ultra-short pulse sources of electromagnetic radiation such as microwave pulses or x-ray pulses.

Although the present invention has been described with reference to specific details, it is not intended that such details should be regarded as limitations upon the scope of the invention, except as and to the extent that they are included in the accompanying claims.

What is claimed is:

1. A source of electromagnetic radiation consisting essentially of:

an amplifying medium and a resonant cavity having an output;

means for generating a drive signal derived from a regenerative feedback signal generated from a portion of said output, further characterized in that said portion is passed through a narrow bandpass filter in generating said regenerative feedback signal and characterized as free of a frequency divider and as free of an external frequency synthesizer; and, means for modulating said electromagnetic radiation within said cavity, said modulation means driven by said drive signal whereby subsequent output is characterized as having pulse durations shorter than about 10,000 periods of the center frequency of said electromagnetic radiation unless restricted to longer pulse durations by the gain band width of the amplifying medium.

2. The source of claim 1 wherein said output is delayed prior to incidence upon a detector for generation of an electrical signal.

3. The source of claim 2 wherein said amplifying medium and a resonant cavity having an output is a laser.

4. The source of claim 3 wherein said laser is a semiconductor laser.

5. The source of claim 3 wherein said output is maintained in an optical delay prior incidence upon a photodetector for generation of an electrical signal.

6. The mode-locked laser light source of claim 3 wherein the narrow bandpass filter has a center frequency corresponding to the inverse of the round trip transit time of light within said cavity.

7. The source of claim 1 wherein said amplifying medium and a resonant cavity having an output is a laser.

8. The source of claim 1 wherein said filtered electrical signal is maintained in an electrical delay for appropriate phase shift prior to operating as said drive signal.

9. A mode-locked laser light source consisting essentially of:

an optical gain medium driven by an appropriate energy source, said optical gain medium having an output from a cavity;

a photodetector for converting a portion of said output into an electrical signal;

a narrow bandpass filter for limiting the frequency band of said electrical signal; and, a modulator for applying said filtered electrical signal to the cavity radiation, said mode-locked laser light source characterized as free of a frequency divider and as free of an external frequency synthesizer.

10. A mode-locked laser light source consisting essentially of:

an optical gain medium driven by an appropriate energy source, said optical gain medium having an output from a cavity;

a photodetector for converting a portion of said output into an electrical signal;

a narrow bandpass filter for limiting the frequency band of said electrical signal;

a modulator for supplying said filtered electrical signal to the cavity radiation; and, an optical delay for control of a phase shift in a portion of said output.

11. A mode-locked laser light source consisting essentially of:

an optical gain medium driven by an appropriate energy source, said optical gain medium having an output from a cavity;

a photodetector for converting a portion of said output into an electrical signal;

a narrow bandpass filter for limiting the frequency band of said electrical signal;

a modulator for applying said filtered electrical signal to the cavity radiation; and, an amplifier acting upon said electrical signal from the photodetector.

12. The mode-locked laser light source of claim 11 further including a second amplifier acting upon said filtered electrical signal.

13. A mode-locked laser light source consisting essentially of:

an optical gain medium driven by an appropriate energy source, said optical gain medium having an output from a cavity;

a photodetector for converting a portion of said output into an electrical signal;

a narrow bandpass filter for limiting the frequency band of said electrical signal; and, a modulator for applying said filtered electrical signal to the cavity radiation, wherein the narrow bandpass filter has a center frequency corresponding to the inverse of the round trip transit time of light within said cavity.

14. A method of generating short pulse electromagnetic signals comprising:

operating a source of electromagnetic radiation having an output;

generating a drive signal derived from a regenerative feedback signal generated from a portion of said output, said output maintained in a delay prior to focus upon a photodetector for generation of said electrical signal, further characterized in that said portion is passed through a narrow bandpass filter in generating said regenerative feedback signal and characterized as free of a frequency divider and as free of an external frequency synthesizer; and, modulating said electromagnetic radiation within said cavity, said modulation driven by said drive signal derived from a regenerative feedback signal generated from a portion of said electromagnetic radiation output whereby said short pulse electromagnetic signals are characterized as having pulse durations shorter than about 10,000 periods of the center frequency of said electromagnetic radiation unless restricted to longer pulse durations by the gain band width of the amplifying medium.

15. The method of claim 14 wherein said source of electromagnetic radiation is a laser.

16. The method of claim 15 wherein said laser is a semiconductor laser.

17. The method of claim 16 wherein said modulating comprises superimposing upon a bias current of said laser the drive signal derived from a regenerative feedback signal generated from a portion of said laser output.

* * * * *